(12) United States Patent
Lee et al.

(10) Patent No.: US 6,514,837 B2
(45) Date of Patent: Feb. 4, 2003

(54) HIGH DENSITY PLASMA CHEMICAL VAPOR DEPOSITION APPARATUS AND GAP FILLING METHOD USING THE SAME

(75) Inventors: Young Suk Lee, Seongnam (KR); Chul-Ju Hwang, Seongnam (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 09/801,518

(22) Filed: Mar. 8, 2001

(65) Prior Publication Data

US 2001/0021592 A1 Sep. 13, 2001

(30) Foreign Application Priority Data

Mar. 8, 2000 (KR) .............................. 00-11425

(51) Int. Cl.[7] .............................................. H01L 21/36
(52) U.S. Cl. ...................................... 438/484; 438/758
(58) Field of Search .............................. 438/484, 758, 438/624; 315/111.51; 427/577; 118/719

(56) References Cited

U.S. PATENT DOCUMENTS

| | | | | |
|---|---|---|---|---|
| 5,804,259 A | * | 9/1998 | Robles | 427/577 |
| 5,937,323 A | * | 8/1999 | Orczyk et al. | 438/624 |
| 6,152,070 A | * | 11/2000 | Fairbairn et al. | 118/719 |
| 6,200,911 B1 | * | 3/2001 | Narwankar et al. | 438/758 |
| 6,239,553 B1 | * | 5/2001 | Barnes et al. | 315/111.51 |

OTHER PUBLICATIONS

Chapter 6: Chemical deposition of Amorphous and polysilicon thin film book: silicon processing in VLSI area (2000) by Wolf and Tauber vol. 1 published by Lattice Press.*

* cited by examiner

*Primary Examiner*—David Nelms
*Assistant Examiner*—Thinh T. Nguyen
(74) *Attorney, Agent, or Firm*—Ostrolenk, Faber, Gerb & Soffen, LLP

(57) ABSTRACT

A high density plasma chemical vapor deposition apparatus includes a vacuum chamber provided with an inlet and an outlet for a reaction gas; a suscepter positioned within the vacuum chamber to mount a wafer thereon, the suscepter having a wafer chuck at its upper surface to prevent the wafer from moving horizontally; a coil antenna surrounding the upper outer wall of the vacuum chamber; an RF generator for applying an RF power to the coil antenna; and a heating unit for heating the wafer mounted on the suscepter. Since the wafer 111 is heated in advance by the wafer heating unit, which is not proposed in the conventional HDP-CVD apparatus, the previously sputtered insulation material is restrained from re-depositing. Therefore, even though a gap has a high aspect ratio, it can be filled without a void.

12 Claims, 4 Drawing Sheets

HIGH DENSITY PLASMA CHEMICAL VAPOR DEPOSITION APPARATUS AND GAP FILLING METHOD USING THE SAME

BACKGROUND OF THE INVENTION

1. Field of the Invention

The present invention relates to a semiconductor device fabrication apparatus and a method for filling a gap using the same, and more particularly, to a high density plasma chemical vapor deposition apparatus that is capable of filling a gap of a high aspect ratio without a void and its method using the same.

2. Description of the Background Art

The gap presented in the descriptions defines a collapsed portion compared with a peripheral pattern during a semiconductor device fabricating processes, such as a trench which is formed between adjacent individual elements or between metal wiring or formed in a STI (Shallow Trench Isolation) process.

As the semiconductor device becomes more integrated, the distance between individual elements or the distance between the metal wiring or the separation region, that is, the width of the trench, is accordingly reduced. Thus, the aspect ratio of the gap formed during the semiconductor device fabricating processes becomes great and it is not easy to fill the gap of a high aspect ratio without a void.

Recently, a technique that the gap of a high aspect ratio is filled with an insulation material by using a high density plasma (referred to as 'HDP', hereinafter) chemical vapor deposition (CVD) is widely employed. In a thin film deposition process using the HDP CVD method, since the process of depositing a thin film and an etching process by sputtering are simultaneously performed, the gap of a high aspect ratio can be effectively filled without a void.

The HDP can be formed by applying appropriately a radio frequency of a single frequency band or a radio frequency of several frequency bands to a coil antenna surrounding a vacuum chamber. Thusly formed plasma is called ICP (Inductively Coupled Plasma).

FIG. 1 is a sectional view for explaining a gap filling method by using a PECVD (Plasma-enhanced CVD) method.

As shown in the drawing, aluminum patterns 20 are formed on a wafer 10 and a gap 30 between the aluminum patterns 20 is filled with a silicon oxide 40.

In this respect, if the step coating of the silicon oxide film 40 is not good, as the deposition process of the silicon oxide film 40 proceeds, the entrance of the gap 30 is clogged by the silicon oxide film 40 before it is wholly filled with the silicon oxide film 40, resulting in that the void 'A' is formed in the gap 30.

This phenomenon is observed to be more serious as the space between the aluminum patterns 20 is narrow, that is, the aspect ratio of the gap 30 is increased. But, by using the HDP CVD method, the phenomenon can be remarkably reduced.

FIG. 2 is a schematic view of a HDP-CVD apparatus in accordance with a conventional art.

As shown in the drawing, a vacuum chamber 11 provided with the gas inlet 21a and a gas output 21b includes an upper container 11a and a lower container 11b. The upper container 11a is made of quartz and formed in a dome shape.

A susceptor 31 is installed in the vacuum chamber 11 and a wafer 41 is mounted on the upper surface of the susceptor 31. A wafer chuck 31a is installed at a periphery of the wafer 41 mounted on the upper surface of the susceptor 31 to prevent the wafer from moving on the upper surface of the susceptor 31.

A coil antenna 51 is installed at the outer wall of the upper container 11a to receive an RF power from an RF generator (not shown). When an RF power of a single frequency band or an RF power of various frequency bands is applied to the coil antenna 51, an HDP 61 is formed at the upper portion of the wafer 41 of the space within the vacuum chamber 11.

The conventional HDP-CVD apparatus is mostly used to fill the gap of a trench in the STI process or to fill the gap between the aluminum wiring, a cooling unit (not shown) is installed in the susceptor 31.

That is, since the temperature of the wafer 41 naturally goes up to about 700° C. due to the HDP energy during the thin film deposition process using plasma, a water cooled tube (not shown) in which a cooling water flows is installed in the susceptor 31 to protect the aluminum wiring formed on the wafer 41.

FIGS. 3A through 3D are sectional views for explaining a gap filling method using the HDP-CVD apparatus of FIG. 2.

FIG. 3A is a sectional view for explaining a process for forming a silicon oxide film 130.

First, when aluminum patterns 120 are formed on the wafer 110, a gap 125 is formed between the aluminum patterns 120. Next, SiH4 gas, O2 gas and Ar gas are mixedly put in the HDP CVD apparatus of FIG. 2, the RF power is applied to the coil antenna 51 to change the gases to a HDP state, and a silicon oxide film 130 is deposited on the resulted structure where the aluminum pattern 120 has been formed.

At this time, in the process of depositing the silicon oxide film 130, since the temperature of the wafer 110 naturally goes up to about 700° C. due to the HDP energy. Thus, in order to thermally protect the aluminum pattern 120, the susceptor on which the wafer is mounted is cooled.

Since the HDP has a high energy, a phenomenon occurs that the silicon oxide film 130 is deposited on the wafer, and at the same time, the deposited silicon oxide film 130 is sputtered by the ions existing in the plasma.

In this respect, since the etching rate of the silicon oxide film 130 is even more rapid at the corner portion of the aluminum pattern 120 than at the other portion, the silicon oxide film 130 has a profile of a 45° sloped face 'B' at the corner portion of the aluminum pattern 120.

Accordingly, even though the deposition process of the silicon oxide film proceeds, the phenomenon of clogging the entrance of the gap 125 does not occur, so that, unlike the case by the conventional PECVD, the gap 125 between the aluminum patterns 120 is filled without a void as shown in FIG. 3B.

However, if the gap 125 becomes narrow, the phenomenon that the silicon oxide which has been etched by sputtering is redeposited, making it difficult to fill the gap without a void even with the conventional HDP-CVD method.

In the case that the silicon oxide which has been etched is redeposited, as shown in FIG. 3C, an overhang portion 'C'; is formed at the silicon oxide film 130 at the corner portion of the aluminum pattern 120, resulting in a problem that, as in the case using the conventional PECVD, the entrance of the gap 125 is first closed to form a void within the gap 125 before the gap 125 is completely filled with the silicon oxide film 130.

In order to solve the problem, if the strength of the plasma is increased, overetching takes place that even the corner portion of the aluminum pattern 120 is etched as shown in FIG. 3D, disadvangateously damaging the aluminum pattern 120.

Thus, in order to fill the narrow gap 125 without a void by using the HDP-CVD method, it is critical to precisely control the redeposition rate of the sputtered silicon oxide.

SUMMARY OF THE INVENTION

Therefore, an object of the present invention is to provide a high density plasma chemical vapor deposition apparatus that is capable of filling a gap without a void, and a gap filling method using the apparatus.

To achieve these and other advantages and in accordance with the purpose of the present invention, as embodied and broadly described herein, there is provided a high density plasma chemical vapor deposition apparatus including: a vacuum chamber provided with an inlet and an outlet for a reaction gas; a susceptor positioned within the vacuum chamber to mount a wafer thereon, the susceptor having a wafer chuck at its upper surface to prevent the wafer from moving horizontally; a coil antenna surrounding the upper outer wall of the vacuum chamber; an RF generator for applying an RF power to the coil antenna; and a heating unit for heating the wafer mounted on the susceptor.

In the high density plasma chemical vapor deposition apparatus of the present invention, the upper portion of the vacuum chamber may be formed in a quartz dome, and a bell jar may be installed outside the quartz dome to cover the quartz dome.

In the high density plasma chemical vapor deposition apparatus of the present invention, the heating unit is installed at least at one of the inside of the susceptor, the inside of the wafer chuck and the bell jar, and its heating element is preferred to be a resistance wire, but in case that it is to be installed at the bell jar, the heating element may be an infrared ray lamp.

The high density plasma chemical vapor deposition apparatus of the present invention may further includes a remote plasma generator installed outside the vacuum chamber; and a plasma transfer tube for connecting the remote plasma generator and the vacuum chamber to transfer the plasma generated in the remote plasma generator to the vacuum chamber.

To achieve the above object, there is also provided a gap filling method in which a trench electrically isolating transistors or a wafer having a gap between gate electrodes made of a polycrystalline silicon is heated in advance to have the temperature of 300~700° C. and the gap is filled with an insulation film by using a HDP CVD apparatus.

In the gap filling method of the present invention, the insulation film is one of USG (undoped silicate glass) film, a PSG (phosphorous silicate glass) film a BPSG (boron phosphorous silicate glass) film and an $O_3$-TEOS (tetraethyl-ortho-silicate) film, and the density of the plasma in the HDP CVD process is preferably $10^{11}$ to $10^{12}$ ion/cm$^3$.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
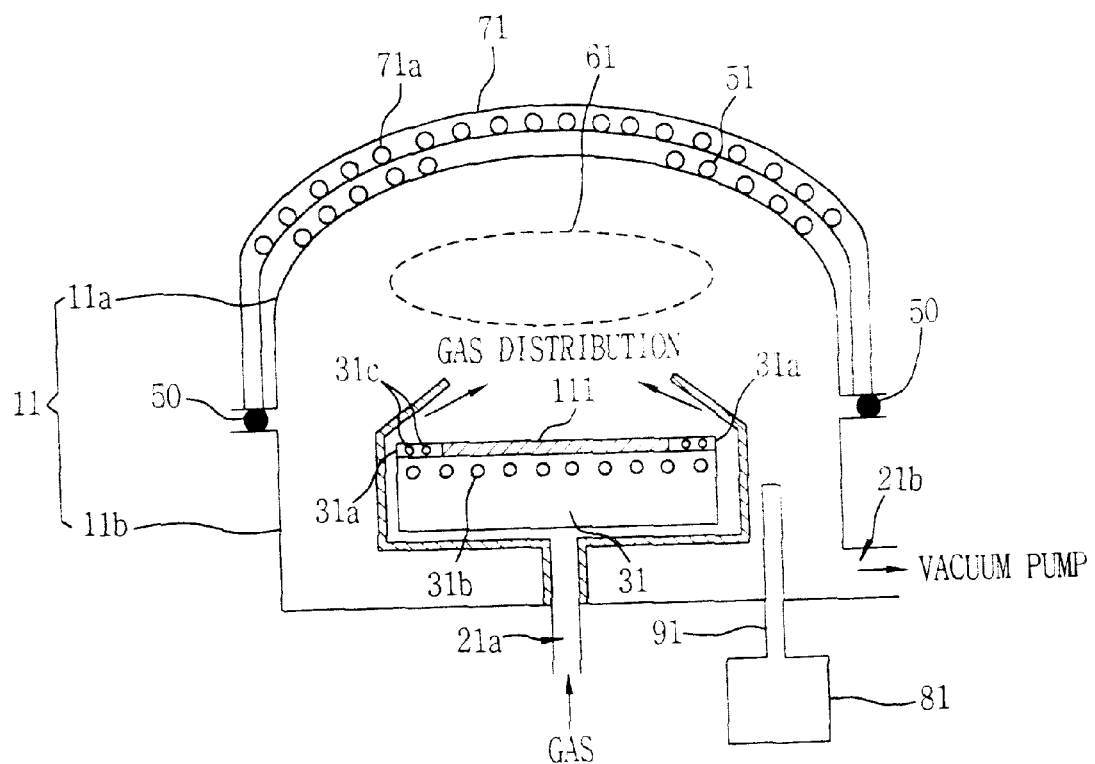
FIG. 4 is a schematic view for explaining HDP-CVD apparatus in accordance with the present invention.

FIG. 4 is a schematic view for explaining HDP-CVD apparatus in accordance with the present invention.

As shown in the drawing, a vacuum chamber 11 provided with the gas inlet 21a and a gas output 21b includes an upper container 11a and a lower container 11b. The upper container 11a is made of quartz and formed in a dome shape.

A susceptor 31 is installed in the vacuum chamber 11 and a wafer 111 is mounted on the upper surface of the susceptor 31. A wafer chuck 31a is installed at a periphery of the wafer 111 mounted on the upper surface of the susceptor 31 to prevent the wafer from moving on the upper surface of the susceptor 31.

A coil antenna 51 is installed at the outer wall of the upper container 11a to receive an RF power from an RF generator (not shown). When an RF power of a single frequency band or an RF power of various frequency bands is applied to the coil antenna 51, an HDP 61 is formed at the upper portion of the wafer 41 of the space within the vacuum chamber 11.

Figure 1:
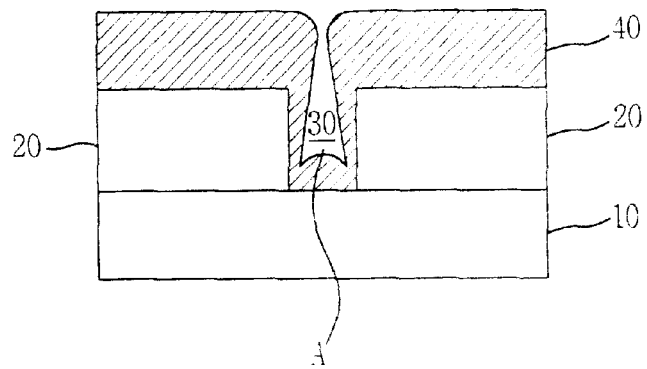
FIG. 1 is a sectional view for explaining a gap filling method by using a conventional PECVD (Plasma-enhanced CVD) method.
Figure 2:
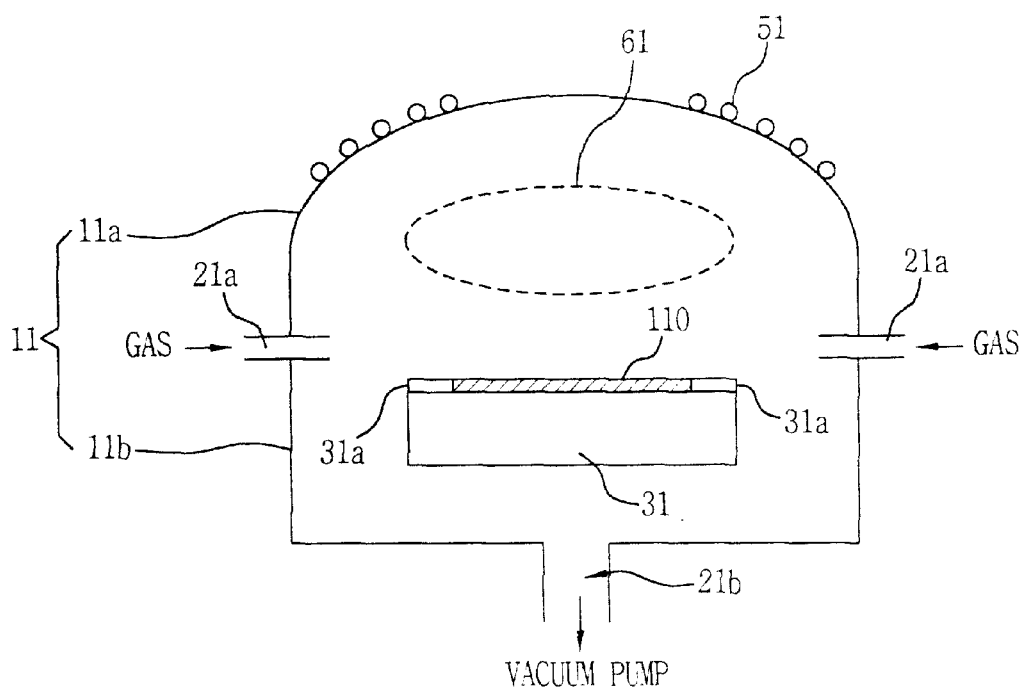
FIG. 2 is a schematic view of a HDP-CVD apparatus in accordance with a conventional art.

With reference to FIG. 2, in the conventional HDP-CVD apparatus, the temperature of the wafer naturally goes up due to the HDP, for which, thus, no heating unit is installed. Rather, in order to protect the aluminum wiring, the water cooled tube is installed at the susceptor 31.

Comparatively, as shown in FIG. 4, the HDP-CVD apparatus of the present invention additionally includes a heating unit to restrain a gap filling material from re-depositing.

The heating unit includes a first heating unit 31b installed inside the susceptor 31, a second heating unit 31c installed inside the wafer chuck 31a and a third heating unit 71a installed at the bell jar which covers the upper chamber 11a.

A heating element of the heating unit is preferred to be a resistance wire, and the third heating unit 71a may use an infrared ray lamp such as a tungsten-halogen lamp, as a heating element to increase a temperature quickly.

And, in order to effectively perform the HDP-CVD process, the HDP CVD apparatus of the present invention further includes a remote plasma generator 81 positioned outside the vacuum chamber 11, to generate plasma, and a plasma transfer tube 91 for transferring the plasma generated from the remote plasma generator 81 to the vacuum chamber 11.

Reference numeral 50 of FIG. 4 is an O-ring installed between the upper reaction chamber 11a and the lower reaction chamber 11b to maintain a gas proof.

Figure 5A:
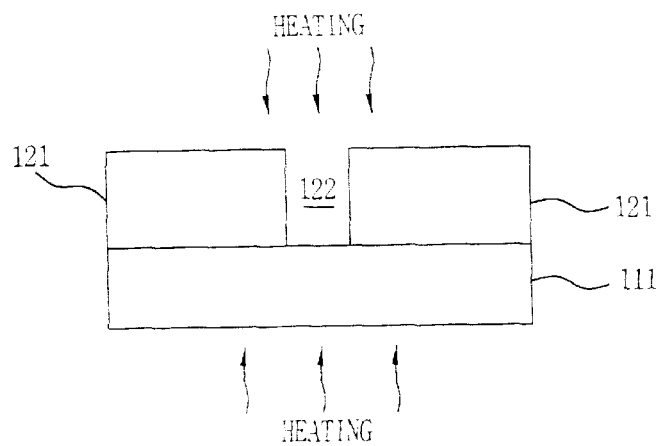
FIGS. 5A through 5C are sectional views for explaining a gap filling method in accordance with the present invention.
Figure 5B:
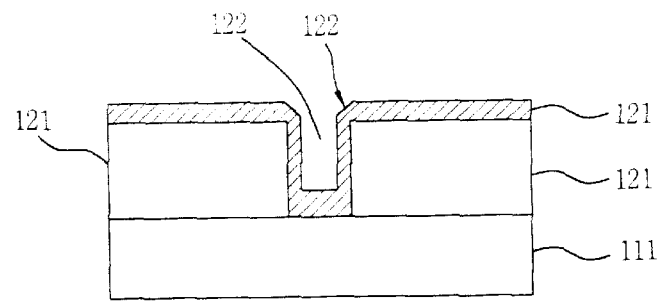
Figure 5C:
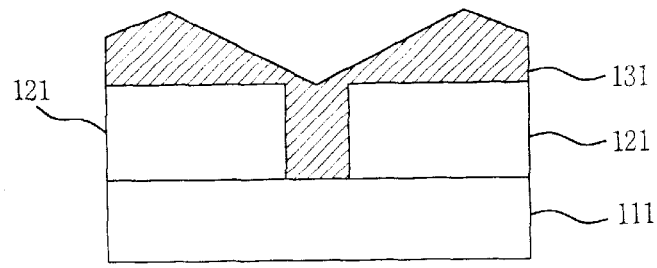

FIGS. 5A through 5C are sectional views for explaining a gap filling method in accordance with the present invention.

FIG. 5A is a sectional view for explaining the process of heating the wafer 111, the characteristic part of the present invention.

In detail, after an impurity-doped polycrystalline silicon film pattern 121 and a wafer 111 having a gap 122 are inserted into the vacuum chamber 11, the wafer 111 is heated by suitably using the first heating unit 31b, the second heating unit 31c and the third heating unit 71a to have the temperature of 300~700° C.

FIG. 5B is a sectional view for explaining the process of forming an insulation film 131.

In detail, $SiH_4$ gas, $O_2$ gas or Ar gas are introduced into the vacuum chamber 11, and the RF power is applied to the coil antenna 51 of FIG. 4 soas to obtain an HDP having a density of $10^{11}$ to $10^{12}$ ion/cm$^3$ from the gases. And then, the insulation film 131 made of a silicon oxide is formed at the upper surface of the polycrystalline silicon film pattern 121 and inside the gap 122.

The insulation film 131 may be a USG (undoped silicate glass) film, a PSG (phosphorus silicate glass) film, a BPSG (boron phosphorous silicate glass) film or a $O_3$-TEOS (tetraethyl-ortho-silicate) film.

In the case of forming the BPSG film as the insulation film 131, $SiH_2$ gas, $B_2H_6$ gas, $PH_3$ gas and Ar gas are introduced into the vacuum chamber 11, to form the HDP.

When the HDP-CVD process is performed by using the semiconductor device fabrication apparatus of FIG. 4, a deposition speed of the thin film (the insulation film of FIG. 5) is determined depending on the difference between the absorption speed and the desorption speed of gas atoms.

In this respect, when the deposition temperature goes up, the desorption speed is greater than the absorption speed, so that the overall thin film deposition speed is reduced, whereas, if the deposition temperature goes down, the overall thin film deposition speed is increased.

Figure 3A:
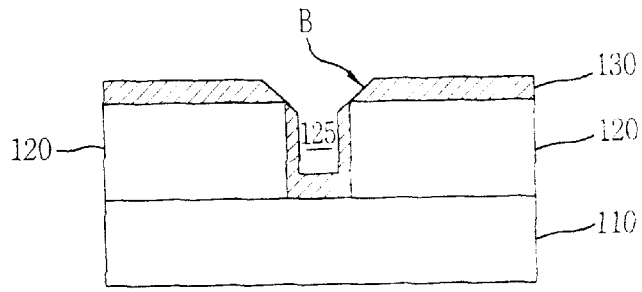
FIGS. 3A through 3D are sectional views for explaining a gap filling method using the conventional HDP-CVD apparatus.
Figure 3B:
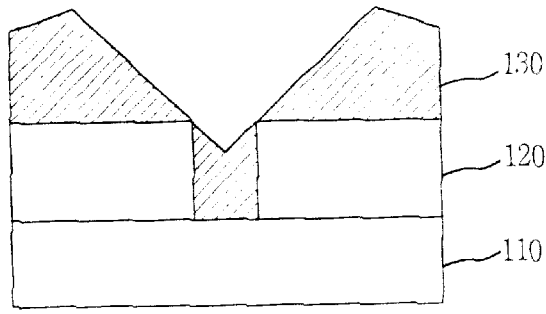
Figure 3C:
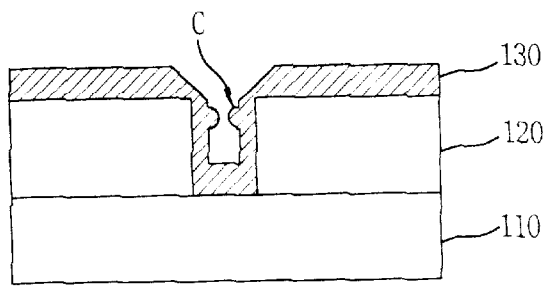
Figure 3D:
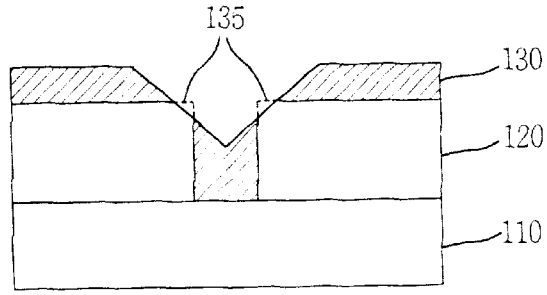

After the wafer is inserted into the vacuum chamber, if the temperature of the wafer 111 is heightened before the insulation film 131 is deposited to fill the gap, the formation of the overhang portion due to the re-deposition as shown in FIG. 3C is effectively prevented and the insulation film 131 having the sloped face "B" is formed at the corner portion of the polycrystalline silicon film pattern 121 at the entrance of the gap.

As the process of deposition of the insulation film 131 proceeds, as shown in FIGS. 3A and 3B, the gap 122 between the polycrystalline silicon film pattern 121 is filled without a void as shown in FIG. 5C.

As so far described, according to the HDP-CVD apparatus and the gap filling method using the HDP-CVD apparatus of the present invention, since the wafer 111 is heated in advance by the wafer heating unit, which is not proposed in the conventional HDP-CVD apparatus, the previously sputtered insulation material is restrained from re-depositing. Therefore, even though a gap has a high aspect ratio, it can be filled without a void.

In addition, since the wafer 111 is forcibly heated to have the temperature of 300~700° C., it is not adoptable to a case that an aluminum wiring pattern is formed on the wafer, because the aluminum wiring pattern is melt at a high temperature. Therefore, the method is preferably adopted to fill a trench formed to electrically isolate the transistors or fill the gap between gate electrodes made of the polycrystalline silicon.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A high density plasma chemical vapor deposition apparatus having a vacuum chamber provided with an inlet and an outlet for a reaction gas; a suscepter positioned within the vacuum chamber to mount a wafer thereon, the suscepter having a wafer chuck at its upper surface to prevent the wafer from moving horizontally; a coil antenna surrounding the upper outer wall of the vacuum chamber; and an RF generator for applying an RF power to the coil antenna; and a heating unit for heating the wafer mounted on the suscepter at a temperature of 400–700° C.

2. The HDP-CVD apparatus of claim 1, wherein the heating unit is stalled inside the suscepter.

3. The HDP-CVD apparatus of claim 2, wherein a heating element of the heating unit is a resistance wire.

4. The HDP-CVD apparatus of claim 1, wherein the heating unit is installed inside the wafer chuck.

5. The HDP-CVD apparatus of claim 4, wherein a heating element of the heating unit is a resistance wire.

6. The HDP-CVD apparatus of claim 1, wherein the upper portion of the vacuum chamber is formed in a quartz dome, and a bell jar is additionally installed outside the quartz dome to cover the quartz dome, and the heating unit is installed inside the bell jar.

7. The HDP-CVD apparatus of claim 6, wherein the heating element of the heating unit is an infrared ray lamp.

8. The HDP-CVD apparatus of claim 1, further comprising:

a remote plasma generator installed outside the vacuum chamber; and a plasma transfer tube for connecting the remote plasma generator and the vacuum chamber to transfer the plasma generated in the remote plasma generator to the vacuum chamber.

9. A method for filling a gap by using a high density plasma chemical vapor deposition apparatus having a vacuum chamber provided with an inlet and an outlet for a reaction gas; a suscepter positioned within the vacuum chamber to mount a wafer thereon, the suscepter having a wafer chuck at its upper surface to prevent the wafer from moving horizontally; a coil antenna surrounding the upper outer wall of the vacuum chamber; an RF generator for applying an RF power to the coil antenna; and a heating unit for heating the wafer mounted on the suscepter, comprising the steps of:

heating in advance the wafer on which patterns and gaps are formed by using a heating unit to have a temperature of 400–700° C.; and introducing gas into the reaction chamber and applying an RF power to the coil antenna to generate plasma, and forming an insulation film inside the tap and at the upper surface of the pattern.

10. The method of claim 9, wherein the insulation film is one of USG (undopped silicate glass) film, a PSG (phosphorous silicate glass) film, a BPSG (boron phosphorous silicate glass) film and an $O_3$-TEOS (tetra-ethyl-orthosilicate) film.

11. The method of claim 9, wherein the density of the plasma is preferably $10^{11}$ to $10^{12}$ ion/cm$^3$.

12. The method of claim 9, wherein the gas is a mixture gas of silicon containing gas, oxygen containing gas and inert gas.

* * * * *